(12) United States Patent
Schmidt et al.

(10) Patent No.: US 8,564,955 B2
(45) Date of Patent: Oct. 22, 2013

(54) COUPLING HEAT SINK TO INTEGRATED CIRCUIT CHIP WITH THERMAL INTERFACE MATERIAL

(75) Inventors: Chad C Schmidt, Menlo Park, CA (US); Richard Lidio Blanco, Jr., Santa Clara, CA (US); Douglas L Heirich, Palo Alto, CA (US); Michael D Hillman, Los Altos, CA (US); Phillip L Mort, Santa Clara, CA (US); Jay S Nigen, Santa Clara, CA (US); Gregory L Tice, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 170 days.

(21) Appl. No.: 13/151,144

(22) Filed: Jun. 1, 2011

(65) Prior Publication Data

US 2011/0228482 A1 Sep. 22, 2011

Related U.S. Application Data

(63) Continuation of application No. 12/415,760, filed on Mar. 31, 2009, now Pat. No. 7,961,469.

(51) Int. Cl.
*H05K 7/20* (2006.01)

(52) U.S. Cl.
USPC ...... 361/705; 361/704; 361/711; 361/679.54; 165/80.3; 165/104.33; 165/185; 257/706; 257/712; 257/713; 257/718

(58) Field of Classification Search
USPC .............. 361/679.46, 679.54, 688, 689, 361/697–712, 715–724; 165/80.3, 80.4, 165/104.33, 185; 257/675, 678, 686, 698, 257/706–727; 174/15.1, 16.3, 252; 29/890.03
See application file for complete search history.

(56) References Cited

U.S. PATENT DOCUMENTS

| | | | |
|---|---|---|---|
| 3,860,949 A | 1/1975 | Stoeckert | |
| 4,151,547 A * | 4/1979 | Rhoades et al. | 257/718 |
| 4,567,505 A | 1/1986 | Pease | |
| 4,962,416 A * | 10/1990 | Jones et al. | 257/722 |
| 5,014,777 A * | 5/1991 | Sano | 165/185 |
| 5,051,814 A | 9/1991 | Paal | |
| 5,168,926 A | 12/1992 | Watson | |
| 5,345,107 A | 9/1994 | Draikoku | |
| 5,495,217 A | 2/1996 | Garcia | |
| 5,591,034 A * | 1/1997 | Ameen et al. | 439/91 |
| 5,706,171 A | 1/1998 | Edwards | |
| 5,729,052 A * | 3/1998 | Tonti et al. | 257/712 |
| 5,745,344 A | 4/1998 | Baska | |
| 5,770,478 A | 6/1998 | Iruvanti | |

(Continued)

FOREIGN PATENT DOCUMENTS

| | | | | |
|---|---|---|---|---|
| JP | 409083165 A * | 3/1997 | | H05K 7/20 |
| JP | 10270614 A * | 10/1998 | | H01L 23/36 |
| JP | 411163231 A * | 6/1999 | | H01L 23/36 |

*Primary Examiner* — Michail V Datskovskiy
(74) *Attorney, Agent, or Firm* — Brownstein Hyatt Farber Schreck, LLP

(57) ABSTRACT

Embodiments of the present invention provide a system for distributing a thermal interface material. The system includes: an integrated circuit chip; a heat sink; and a compliant thermal interface material (TIM) between the integrated circuit chip and the heat sink. During assembly of the system, a mating surface of the heat sink and a mating surface of the integrated circuit chip are shaped to distribute the TIM in the predetermined pattern as the TIM is pressed between the mating surface of heat sink and a corresponding mating surface of the integrated circuit chip.

23 Claims, 9 Drawing Sheets

(56) References Cited

U.S. PATENT DOCUMENTS

| | | |
|---|---|---|
| 5,825,087 A | 10/1998 | Iruvanti |
| 5,891,755 A | 4/1999 | Edwards |
| 5,905,636 A | 5/1999 | Baska |
| 5,945,217 A * | 8/1999 | Hanrahan ............... 428/389 |
| 5,985,697 A | 11/1999 | Chaney |
| 6,088,915 A | 7/2000 | Turturro |
| 6,225,695 B1 | 5/2001 | Chia |
| 6,262,883 B1 | 7/2001 | Kim |
| 6,304,441 B1 | 10/2001 | Han |
| 6,333,551 B1 * | 12/2001 | Caletka et al. ............ 257/707 |
| 6,407,924 B1 * | 6/2002 | Brodsky ................... 361/704 |
| 6,437,438 B1 * | 8/2002 | Braasch ................... 257/712 |
| 6,455,924 B1 | 9/2002 | Alcoe |
| 6,657,269 B2 | 12/2003 | Migliorato |
| 6,748,350 B2 * | 6/2004 | Rumer et al. ................ 703/9 |
| 6,774,482 B2 | 8/2004 | Colgan |
| 6,830,960 B2 | 12/2004 | Alcoe |
| 6,868,899 B1 | 3/2005 | White |
| 6,891,724 B2 | 5/2005 | De Lorenzo |
| 7,085,135 B2 | 8/2006 | Chu |
| 7,102,226 B2 * | 9/2006 | Fitzgerald et al. ......... 257/712 |
| 7,120,023 B2 | 10/2006 | Whit |
| 7,239,517 B2 * | 7/2007 | Fitzgerald et al. ......... 361/704 |
| 7,256,058 B2 * | 8/2007 | Fitzgerald et al. .......... 438/15 |
| 7,268,427 B2 * | 9/2007 | Anzai ....................... 257/707 |
| 7,268,428 B2 | 9/2007 | Edwards |
| 7,280,357 B2 | 10/2007 | Tomioka |
| 7,282,799 B2 * | 10/2007 | Brunschwiler et al. ..... 257/718 |
| 7,288,839 B2 | 10/2007 | Colgan |
| 7,358,606 B2 * | 4/2008 | Rumer et al. .............. 257/713 |
| 7,394,657 B2 | 7/2008 | Hoivik |
| 7,394,659 B2 | 7/2008 | Colgan |
| 7,468,886 B2 | 12/2008 | Coico |
| 7,499,280 B2 | 3/2009 | Otsuki |
| 7,547,582 B2 * | 6/2009 | Brunschwiler et al. ...... 438/123 |
| 7,724,527 B2 | 5/2010 | Coico |
| 7,737,550 B2 * | 6/2010 | MacQuarrie et al. ......... 257/712 |
| 7,748,440 B2 | 7/2010 | Michel |
| 7,782,620 B2 * | 8/2010 | Tomioka et al. ............. 361/704 |
| 7,863,731 B2 * | 1/2011 | Chen et al. ................. 257/706 |
| 7,876,565 B2 * | 1/2011 | Hoivik et al. ............... 361/704 |
| 7,996,989 B2 * | 8/2011 | Dani et al. ................. 29/890.03 |
| 8,156,998 B2 * | 4/2012 | Furman et al. ............. 165/80.3 |
| 8,269,340 B2 * | 9/2012 | Gaynes et al. ............. 257/707 |
| 2004/0001316 A1 | 1/2004 | Kamikawa |
| 2004/0040327 A1 * | 3/2004 | Iida et al. .................. 62/259.2 |
| 2005/0127500 A1 | 6/2005 | Colgan et al. .............. 257/706 |
| 2006/0039113 A1 | 2/2006 | Cheng |
| 2006/0215269 A1 | 9/2006 | Abe |
| 2006/0215369 A1 * | 9/2006 | Ohashi et al. .............. 361/704 |
| 2006/0227510 A1 * | 10/2006 | Fitzgerald et al. .......... 361/704 |
| 2006/0238984 A1 | 10/2006 | Belady |
| 2006/0286712 A1 | 12/2006 | Brunschwiler |
| 2008/0165502 A1 | 7/2008 | Furman |
| 2008/0296757 A1 * | 12/2008 | Hoffman et al. ............ 257/713 |
| 2009/0039503 A1 | 2/2009 | Tokita |
| 2009/0059537 A1 * | 3/2009 | MacQuarrie et al. ......... 361/711 |
| 2009/0096087 A1 | 4/2009 | Sauciuc |
| 2009/0195989 A1 * | 8/2009 | Oda ......................... 361/709 |
| 2009/0296354 A1 | 12/2009 | Tomioka |
| 2010/0037461 A1 | 2/2010 | Michel |
| 2010/0110638 A1 | 5/2010 | Yumoto |

\* cited by examiner

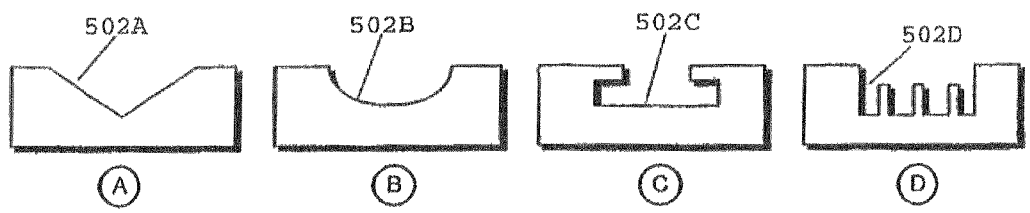
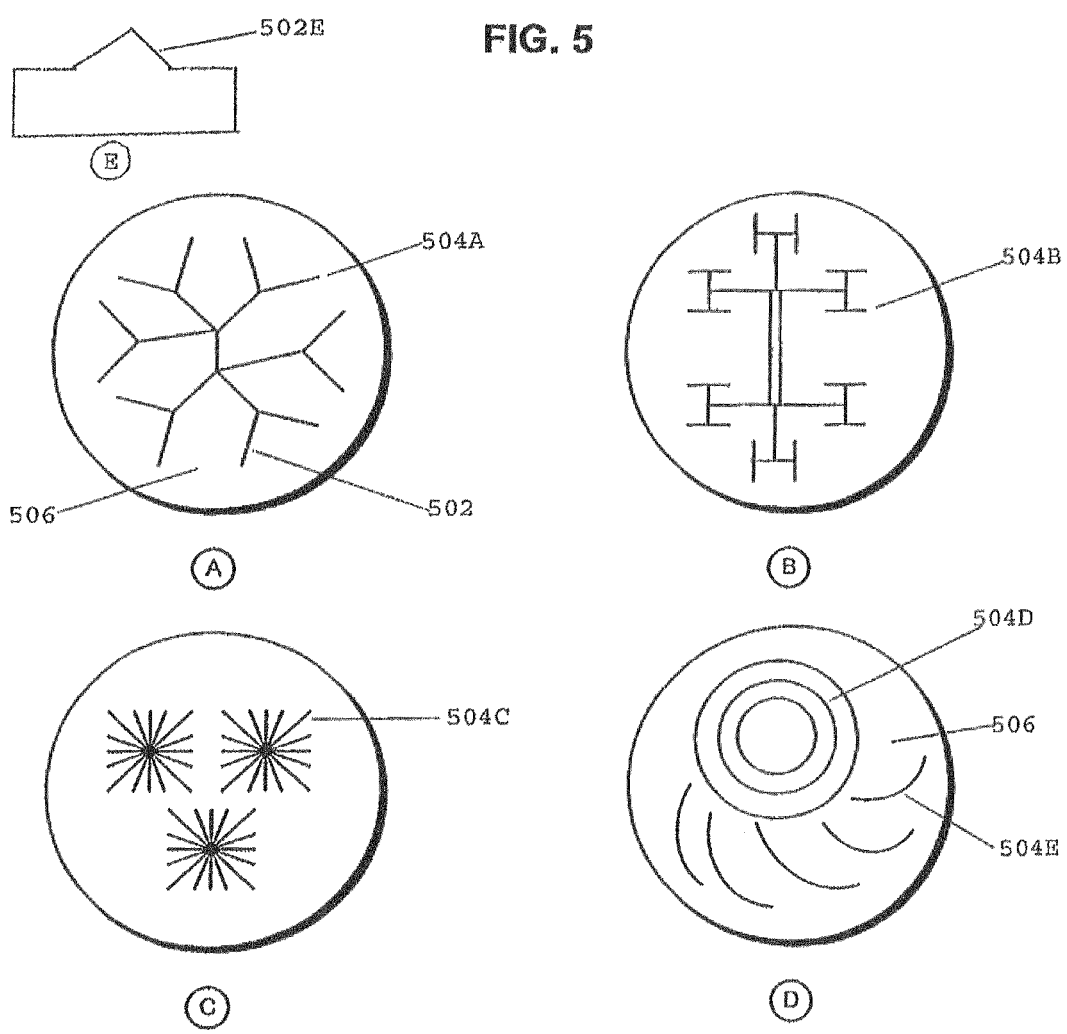
FIG. 5
FIG. 6

COUPLING HEAT SINK TO INTEGRATED CIRCUIT CHIP WITH THERMAL INTERFACE MATERIAL

RELATED APPLICATIONS

This application is a continuation application of, and hereby claims priority under 35 U.S.C. §120 to, pending U.S. patent application Ser. No. 12/415,760, entitled "Method and Apparatus for Distributing a Thermal Interface Material," by inventors Chad C. Schmidt, Richard Lidio Blanco, Jr., Douglas L. Heirich, Michael D. Hillman, Phillip L. Mort, Jay S. Nigen and Gregory L. Tice, filed on 31 Mar. 2009.

BACKGROUND

1. Field of the Invention

The described embodiments relate to computer systems. More specifically, the described embodiments relate to the distribution of a thermal interface material in a computer system.

2. Related Art

With recent increases in processing speed and reductions in feature sizes, integrated circuit chips (ICs) have begun to consume more power. This has led to a corresponding increase in the operating temperatures of the ICs. Increased operating temperatures can cause inefficient operation, computational errors, or chip failures. Consequently, many ICs include a heat sink that is coupled to the IC to draw heat from the IC. The heat sink maintains lower operating temperatures for the IC, thereby enabling improved operation and longer chip life.

Heat sinks typically have a smooth surface (a "mating surface") that is placed in contact with the IC and a body that absorbs heat from the IC. Generally, the surface area of the heat sink is significantly larger than the surface area of the IC, thereby providing a larger surface area for dispersing heat generated by the IC. Some heat sinks also include heat dispersion features such as fins, radiators, fans, heat pipes, liquid cooling, phase-change cooling, and/or other features.

The mating surface of a heat sink is typically fabricated with tight tolerances for smoothness (i.e., straightness, levelness, etc.). However, fabricating the heat sink's mating surface so that it is smooth within tolerances of less than dozens of microns is prohibitively expensive. Thus, there are often variations in the smoothness of the heat sink's mating surface. In addition, there may be variations in the smoothness of the mating surface of the IC. These variations in the smoothness can cause significant gaps to occur if the heat sink is used by being placed in contact with the IC. These gaps prevent the heat sink from properly absorbing heat from the affected area of the IC, which can lead to hotspots on the IC, with the attendant risk of damage from overheating and/or uneven heating of the IC. Thus, in most systems, a thermal interface material (TIM) is placed between the heat sink and the IC to provide a heat-conductive interface between the IC and the heat sink. The TIM can fill the gaps between the IC and the heat sink, thereby enabling the heat sink to more effectively draw heat from the IC.

One common form of TIM is a heat-conductive paste or grease that is spread in a layer between the heat sink and the IC. Assembling the heat sink and the IC typically involves placing a drop or dollop of TIM on the IC or heat sink and then pressing the heat sink and the IC together. Under this pressure, the TIM is spread from its initial position to cover the entire mating surface. Unfortunately, certain patterns in the spread of the TIM can result in the TIM being distributed unevenly between the heat sink and the IC. This uneven distribution of TIM can lead to localized hot-spots on the IC, with the attendant risk of damage from overheating and/or uneven heating of the IC.

SUMMARY

Embodiments of the present invention provide a system for distributing a thermal interface material. The system includes: an integrated circuit chip; a heat sink; and a thermal interface material (TIM). A mating surface of the heat sink and a mating surface of the integrated circuit chip are thermally coupled together with the TIM located between the mating surface of the heat sink and the mating surface of the integrated circuit chip. At least one of the mating surface of the heat sink or the mating surface of the integrated circuit chip includes three-dimensional (3D) surface features that cause the TIM to be distributed between the heat sink and the integrated circuit chip in a predetermined pattern as the heat sink and the integrated circuit chip are coupled together.

In some embodiments, the 3D surface features in the mating surface can include one or more areas of the mating surface that are elevated or indented with respect to a remainder of the mating surface.

In some embodiments, the 3D surface features of the integrated circuit chip or the heat sink can include: tapered regions, plateaus, pyramids, domes, divots, protrusions, or indentations.

In some embodiments, the 3D surface features include at least one sub-feature. In these embodiments, the sub-feature includes: undercuts, grooves or ribs, or protrusions or indentations.

In some embodiments, the 3D surface features of at least one of the integrated circuit chip or the heat sink include one or more grooves or ridges. In these embodiments, the cross section of the grooves or ridges can be semicircular, polygonal, irregular, or another cross section.

In some embodiments, the grooves or ridges can be arranged in a pattern or combination of patterns that causes the TIM to be distributed in the predetermined pattern. In these embodiments, the patterns can include: an H-tree, a bio-mimicking pattern, a burst pattern, a random pattern, one or more geometric shapes, or one or more straight or curved lines.

In some embodiments, the grooves or ridges are tapered. In these embodiments, at least one of a width of a groove or ridge or a depth of a groove or ridge varies along a length of the groove or ridge.

In some embodiments, the grooves or ridges include at least one sub-feature. In these embodiments, the sub-feature can include undercuts, grooves or ribs, or protrusions or indentations.

In some embodiments, the mating surface of the integrated circuit chip is substantially flat and the mating surface of the heat sink is double-saddle shaped.

In some embodiments, the predetermined pattern is configured so that a specified thickness of the TIM is located on one or more predetermined areas of the mating surface when the integrated circuit chip and the heat sink are coupled together.

In some embodiments, the TIM is placed on at least one of the mating surface of the heat sink or the mating surface of the integrated circuit chip in a predefined pattern before the integrated circuit chip and the heat sink are coupled together.

In some embodiments, the system includes an external assist feature positioned proximate to the integrated circuit chip and the heat sink. In these embodiments, the external assist feature is configured to retain or redistribute the TIM between the mating surface of the integrated circuit chip and the mating surface of the heat sink when the integrated circuit chip and the heat sink are coupled together.

In some embodiments, the integrated circuit chip and the heat sink are coupled together by pressing, sliding, clamping, twisting, placing, or otherwise coupling together the integrated circuit chip and the heat sink so that the 3D surface features on the heat sink or the integrated circuit chip cause the TIM to be distributed in the predetermined pattern.

BRIEF DESCRIPTION OF THE FIGURES

FIG. 5 presents a number of exemplary groove geometries in accordance with some embodiments.

FIG. 6 presents examples of groove arrangements in accordance with some embodiments.

In the figures, like reference numerals refer to the same figure elements.

DETAILED DESCRIPTION

Figure 1:
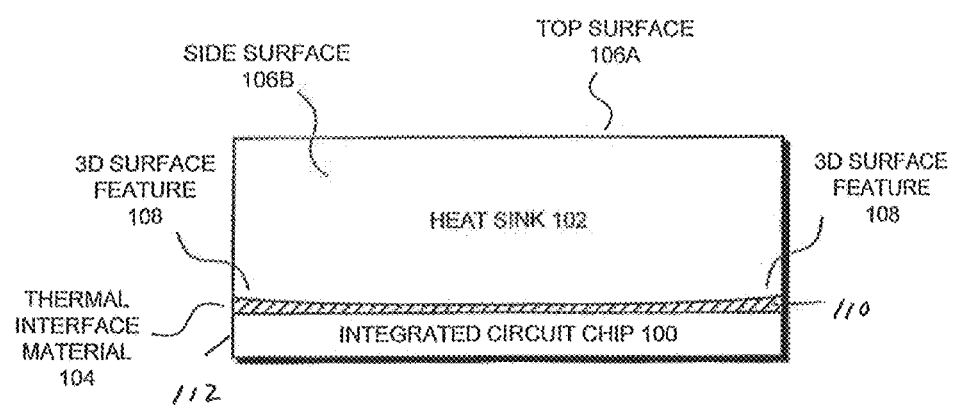
FIG. 1 presents a front view and an isometric view of a heat sink thermally coupled to an integrated circuit in accordance with some embodiments.
Figure 1:
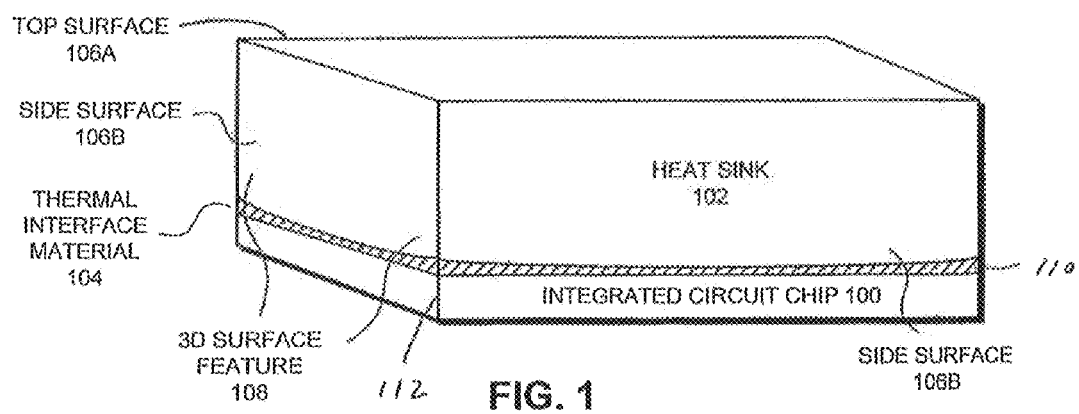

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the system is not limited to the embodiments shown, but is to be accorded the widest scope consistent with the principles and features disclosed herein.

Terminology

Throughout the description, we use the following terminology. These terms are generally known in the art, but are described below to clarify the subsequent descriptions.

The term "coupled" as used in this description indicates that one element is put together with, touching, or otherwise physically connected with another element. The connection can be a direct physical connection, such as two elements contacting one another, or can be an indirect physical connection, such as two elements contacting one or more intermediate elements. For example, in some embodiments, a heat source is coupled to a heat sink through an intermediate thermal interface material (TIM), which is an indirect physical connection between the heat source and the heat sink. For indirect physical connections, any number of intermediate elements may be included, some of which may not be directly contacted by the coupled elements. For example, in some embodiments, a heat source is coupled to a heat sink through two or more intermediate TIMs that are arranged in layers. In these embodiments, the heat source may physically contact one layer of the intermediate TIMs, while the heat sink physically contacts a different layer.

The term "thermally coupled" as used in this description indicates a coupling through which heat can flow from a heat source to a heat sink. The coupling can include any number of liquid, solid, or gaseous intermediate materials, devices, or layers. For example, in some embodiments, a heat sink is thermally coupled to a heat source through a TIM that enables heat to flow from the heat source into the heat sink. In these embodiments, the TIM is sandwiched between a surface of the heat sink and a surface of the heat source ("mating surfaces" of the heat source and the heat sink) so that both the heat sink and the heat source directly contact the TIM. The thermal coupling can be isotropic, so that heat flows freely in all directions through the thermal coupling, or anisotropic, so that heat flows more freely in a predetermined direction.

The term "some embodiments" as used in this description indicates a subset of the possible embodiments of the present invention. Each reference to "some embodiments" may include some or all of the same embodiments. However, not all references to "some embodiments" necessarily refer to the same subset of embodiments.

Integrated Circuit Chip with Heat Sink

FIG. 1 presents a front view and an isometric view of a heat sink thermally coupled to an integrated circuit in accordance with the described embodiments. FIG. 1 includes integrated circuit chip (IC) 100, heat sink 102, and thermal interface material (TIM) 104.

IC 100 is a semiconductor chip such as a microprocessor, an application-specific integrated circuit (ASIC), a programmable logic device, a memory, a controller, a test circuit, or another semiconductor chip. During operation, IC 100 produces heat. (The processes by which heat is produced in integrated circuits during operation are generally known in the art and hence are not described in more detail.)

In some embodiments, the heat produced by IC 100 during operation is sufficient to have a detrimental effect on the operation or lifespan of IC 100, or the operation or lifespan of other components (e.g., a mounting mechanism for IC 100, a circuit board to which IC 100 is coupled, other nearby circuit elements, etc.), and/or to render the use of an electronic device in which IC 100 is included uncomfortable or impractical for a user. Thus, IC 100 is thermally coupled to heat sink 102, which absorbs heat produced by IC 100 during operation. By absorbing the heat produced by IC 100, heat sink 102 enables the maintenance of a predetermined operating temperature for IC 100, thereby improving the operating conditions of IC 100.

As shown in FIG. 1, heat sink 102 comprises a block of heat-absorbing material that absorbs heat produced in IC 100. Along with absorbing the heat, heat sink 102 provides an extended surface area for the dispersion of absorbed heat into the surrounding atmosphere. In some embodiments, heat sink 102 is fabricated using a material such as a metal (e.g., aluminum, copper, etc.), a ceramic, a composite material, or another heat-conductive chemical compound. In alternative embodiments, heat sink 102 is fabricated using two or more materials. For example, in some embodiments, heat sink 102 can include two or more layers of material that cause excess heat to flow toward the outside surface of heat sink 102 for dispersion into the surrounding atmosphere (or into another material, such as a liquid coolant).

Although not shown in FIG. 1, in some embodiments, heat sink 102 includes additional "passive" features that enable the dispersion of absorbed heat. The passive features can include features fabricated in heat sink 102 to increase the surface area of heat sink 102 and other such mechanisms. For example, heat sink 102 can include one or more fins, ribs, posts, shells, domes, or other features that protrude from top surface 106A and/or side surfaces 106B of heat sink 102 (or the unseen surfaces of heat sink 102).

In addition, although not shown in FIG. 1, in some embodiments, heat sink 102 includes additional "active" features that enable the dispersion of absorbed heat. For example, heat sink 102 can include fans, radiators, Peltier devices, or other elements. Heat sink 102 can also be a part of a "liquid cooling" system, wherein liquid flows around or through heat sink 102 and to a remote heat dispersion mechanism (e.g., a reservoir of liquid, a radiator, etc.). Moreover, heat sink 102 can be coupled to, or can itself be, a phase change cooler, a heat pipe, or another device or devices.

TIM 104 is a material that can be placed between a heat sink (e.g., heat sink 102) and a heat source (e.g., integrated circuit chip 100) to enable the heat sink to absorb heat produced by the heat source. Generally, it is expensive and impractical to manufacture both IC 100 and heat sink 102 so that the surfaces through which IC 100 is coupled to heat sink 102 (interchangeably called the "mating surfaces") are smooth (i.e., straight, level, etc.) on a scale of tens of microns. Because the mating surfaces are not smooth, gaps can occur if heat sink 102 is simply placed in contact with IC 100. Thus, TIM 104 is sandwiched between heat sink 102 and IC 100 to fill the gaps between heat sink 102 and IC 100, thereby enabling more efficient removal of heat from IC 100.

TIM 104 includes at least one material with high thermal conductivity that enables heat to travel from a heat source through TIM 104 to a heat sink. For example, the TIM 104 can include metal particles such as silver or platinum, a ceramic (e.g., aluminum oxide, zinc oxide, etc.), a specialized chemical compound, carbon, or another material. In some embodiments, TIM 104 also includes one or more materials such as greases, a silicone compounds, oils, waxes, pastes, and/or other chemical compounds that serve as a suspension medium, a protectant, and/or a sealant for the material with high thermal conductivity. In some embodiments, the suspension medium itself is a heat conductor. For example, silicone grease is one possible heat-conductive suspension medium. In some embodiments, TIM 104 can include a liquid metal such as an alloy of gallium or another liquid metal alloy.

In some embodiments, TIM 104 is a viscous, spreadable material. For example, TIM 104 can be a grease, oil, paste, or another spreadable material. In alternative embodiments, TIM 104 is a solid or semi-solid material which spreads or otherwise changes shape upon the application of typical assembly pressures (e.g., 0.5-4 lbs., hand-assembly pressures, etc.). For example, TIM 104 can be a wax, a graphite, a woven material, or another solid or semi-solid material.

As shown in FIG. 1, the mating surface of heat sink 102 includes three-dimensional (3D) surface features 108. Specifically, as shown in FIG. 1, the corners 112 of heat sink 102 are raised with respect to the remainder of the mating surface of heat sink 102 resulting in a "double-saddle" shape 110 in the mating surface. As described in detail below, when assembling IC 100 and heat sink 102, 3D surface features 108 enable a predetermined distribution of TIM 104 (interchangeably referred to as the "post-assembly distribution" of TIM 104).

The 3D surface features 108 are "three-dimensional" in comparison to a mating surface without 3D surface features, which is substantially smooth. The 3D surface features can be indented in the mating surface, or can protrude from the mating surface. Although embodiments can use any size of surface feature or combination of surface features that enables a predetermined distribution of TIM 104, in some embodiments, the surface features are sized on a scale of microns.

In some embodiments, the post-assembly distribution of TIM 104 can be aligned with known hotspots or other features in IC 100 to enable more efficient (or less efficient) heat removal from these areas. More specifically, a thinner layer of TIM 104 can be arranged over hotter portions of IC 100. In these embodiments, a thinner layer of TIM 104 can lead to heat sink 102 absorbing heat more efficiently from IC 100 because heat sink 102 can absorb heat more readily than TIM 104 transfers heat.

Figure 10:
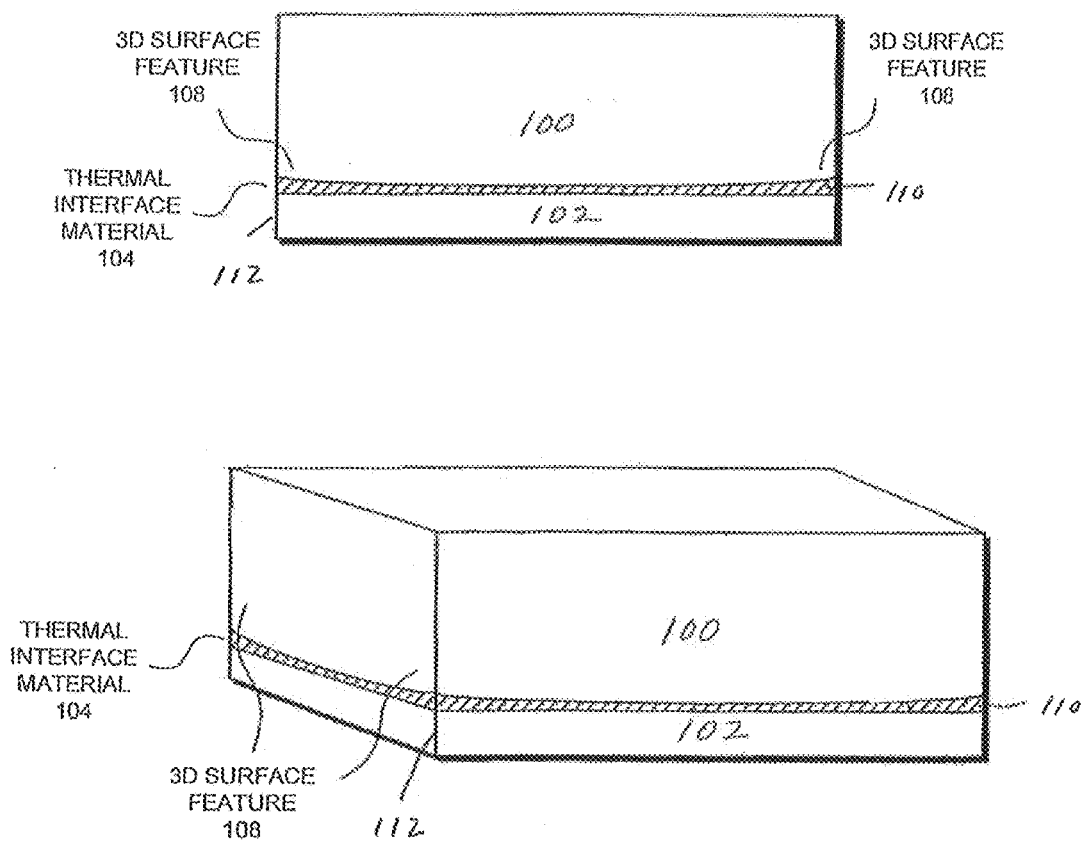
FIG. 10 presents a front view and an isometric view of a heat sink thermally coupled to an intergrated circuit in accordance with other embodiments.

Although we describe heat sink 102 alone as including 3D surface features 108, in alternative embodiments as shown in FIG. 10, 3D surface features 108 are also present in the mating surface of IC 100. In some embodiments, the 3D surface features are present on IC 100 alone. In the embodiments where the 3D surface features 108 are on only one of IC 100 or heat sink 102, the element without surface features is substantially smooth and straight.

In some embodiments, in addition to 3D surface features 108, the mating surface of heat sink 102 or IC 100 includes deposited material, such as metal, ceramic, glass, lubricant, or other material(s) that enable the predetermined distribution of TIM 104. In some embodiments, these materials are part of (i.e., are fused with or built into) the mating surface. In alternative embodiments, the materials are applied to the outer surface of the mating surface.

Although we describe embodiments using an integrated circuit (IC 100), other embodiments use different types of circuits. For example, some or all of the circuits in IC 100 can be discrete circuit elements such as amplifiers, resistors, capacitors, etc. Generally, heat sink 102 in these embodiments can be used to draw heat from these circuit elements.

In addition, although heat sink 102 is shown in FIG. 1 with a particular set of 3D surface features 108, in alternative embodiments, a different number or a different type of surface features can be present in the mating surface of heat sink 102. In addition, heat sink 102 itself is shown with particular dimensions in the figures in this application. However, in alternative embodiments, heat sink 102 can be of different dimensions (i.e., thinner, broader, etc.).

Furthermore, although IC 100 and heat sink 102 are shown with IC 100 directly below heat sink 102, alternative embodiments position heat sink 102 below or beside IC 100. Other alternative embodiments use different shapes for heat sink 102, such as a housing or sleeve that encloses IC 100, etc.

IC 100 and heat sink 102 can be included in any of a number of different types of devices. For example, IC 100 and heat sink 102 can be part of a desktop computer, a laptop computer, a server, a media player, an appliance, a cellular phone, testing equipment, a network appliance, a calculator, a personal digital assistant (PDA), a hybrid device (e.g., a "smart phone"), a guidance system, audio-visual equipment, a toy, a control system (e.g., an automotive control system), manufacturing equipment, or another electronic device.

Assembly of Integrated Circuit Chip and Heat Sink

As described above, IC 100 and heat sink 102 are assembled (i.e., "coupled together") with TIM 104 located between IC 100 and heat sink 102. In some embodiments, the assembly process involves placing the TIM 104 on the surface of IC 100 and/or heat sink 102 and pressing, sliding, clamping, twisting, placing, or otherwise coupling together IC 100 and heat sink 102. By coupling together IC 100 and heat sink 102 as described, the 3D surface features 108 on heat sink 102 (or on IC 100) cause the TIM 104 to be distributed in a predetermined pattern, resulting in a specified post-assembly distribution of TIM 104.

In some embodiments, IC 100 and heat sink 102 are hand-assembled. Hand assembly involves a human coupling together IC 100 and heat sink 102 by hand. In these embodiments, 3D surface features 108 and/or TIM 104 can be configured to work with the expected pressures, torques, etc. and potential variances that occur during the hand assembly process. As described below, a number of assist features may be included in IC 100, heat sink 102, and/or a mechanical support (e.g., a circuit board) to which IC 100 or heat sink 102 is mounted to enable proper assembly of IC 100 and heat sink 102.

In alternative embodiments, IC 100 and heat sink 102 are machine-assembled. Machine assembly involves a machine coupling together IC 100 and heat sink 102 using one or more assembly mechanisms. (Machine assembly mechanisms are known in the art and hence are not described in more detail.) In these embodiments, 3D surface features 108 and/or TIM 104 can be configured to work with the expected pressures, torques, etc. and potential variances that occur during the machine assembly process. As described below, a number of assist features may be included in IC 100, heat sink 102, and/or a mechanical support (e.g., a circuit board) to which IC 100 or heat sink 102 is mounted to enable proper assembly of IC 100 and heat sink 102.

In some embodiments, IC 100 and/or heat sink 102 include one or more assist features that assist with assembling IC 100 and heat sink 102. For example, IC 100 and/or heat sink 102 may include one or more alignment features such as posts, walls, guides, depressions, cut-outs, etc. In addition, IC 100 and/or heat sink 102 may include one or more assembly features such as clamps/levers, cams, braces, housings, shrouds, or other assembly features.

In some embodiments, IC 100 or heat sink 102 is coupled to a circuit board, a backing, or another mechanical support. In these embodiments, the circuit board (or other mechanical support) can include one or more assist features that assist with coupling together IC 100 and heat sink 102. For example, assuming that IC 100 is a microprocessor coupled to a mounting socket in a circuit board, the circuit board and/or mounting socket may include one or more alignment features such as posts, guides, etc. In addition, the circuit board and/or mounting socket may include one or more levers, cams, braces, housings, shrouds, or other assembly features that are used to couple together IC 100 and heat sink 102.

For example, assuming an embodiment where IC 100 and heat sink 102 are hand assembled, the embodiment can include posts or guides for ensuring that IC 100 and heat sink 102 are properly located (i.e., aligned with respect to one another and, if applicable, to a mechanical support), and can also include a clamp with a cam for clamping together IC 100 and heat sink 102 with the proper amount of pressure. In this embodiment, the profile of the pressure applied by the clamp (i.e., the locations where pressure is applied) can be accounted for in the configuration of 3D surface features 108. Specifically, the 3D surface features 108 can include one or more features that cause TIM 104 to be distributed in a predetermined pattern when the pressure of the clamp is applied during assembly.

Thermal Interface Material Distribution Pattern

In some embodiments, the post-assembly distribution of TIM 104 is an even distribution of TIM 104 between IC 100 and heat sink 102. In these embodiments, the bond-line thickness (i.e., the "BLT" or "depth" of TIM 104) is similar throughout the area where IC 100 and heat sink 102 are thermally coupled (throughout the area described by the mating surface). For example, assuming that TIM 104 is a grease with 5 micron metal or ceramic particles, the post-assembly distribution of TIM 104 can be such that a layer of TIM 104 15-30 microns deep is spread throughout the mating surface.

In some embodiments, the post-assembly distribution of TIM 104 can be of varying BLT. In these embodiments, the depth of TIM 104 can be different at different locations within the area described by the mating surface of IC 100 and heat sink 102. For example, assuming that TIM 104 is a grease with 5 micron metal or ceramic particles, the post-assembly distribution of TIM 104 can be such that an even layer of TIM 104 20-30 microns deep occurs over most of the area of the mating surface, with an 8-15 micron layer of TIM 104 over selected areas of the mating surface.

In some embodiments, the variations in the thickness can be aligned with particular hotspots on IC 100. More specifically, TIM 104 can be thinner over hotspots, thereby allowing heat sink 102 to more readily absorb heat from these hotspots. In some of these embodiments, tight tolerances in BLT can be enforced (using particular patterns in 3D surface features 108) over hotspots at the expense of tolerances over cooler areas of IC 100. For example, assuming that IC 100 is a processor, 3D surface features 108 can be configured so that a minimally thin layer of TIM 104 is situated over an execution unit in a processor, while a thicker layer of TIM 104 is situated over a cache in the processor. Note that in some embodiments, the thinner layer of TIM 104 generally leads to heat sink 102 absorbing heat more efficiently from IC 100 because heat sink 102 absorbs heat more readily than TIM 104 transfers heat.

In some embodiments, the 3D surface features 108 are determined based on the flow characteristics of TIM 104. For example, modeling TIM 104 as a fluid (i.e., where TIM 104 is a grease or another spreadable substance), using techniques that are known in the art, it is possible to compute parameters such as feed rate, turbulence, back waves, particle suspension (i.e., particle drop-out, etc.), and percentage of loading based on potential 3D surface features. In these embodiments, the 3D surface features 108 can be configured to reduce or accentuate their effects on TIM 104's flow dynamics. For example, in or near transitions in 3D surface features such as indentations or protrusions, the 3D surface features can be arranged to avoid transitions (e.g., steps in features such as the wall of a protrusion or T-junctions in grooves) where flow dynamics are disrupted. By avoiding the disruption of flows, these embodiments can avoid TIM 104 build-up or scarcity, and can thus provide proper post-assembly distributions of TIM 104.

Three-Dimensional Surface Features

As described above, the embodiments include 3D surface features 108 in heat sink 102 or in IC 100. However, although heat sink 102 is shown in FIG. 1 with a particular set of 3D surface features 108, in alternative embodiments, a different number and/or a different type of surface features can be present in the mating surfaces of heat sink 102 and/or IC 100. For example, the 3D surface features 108 can include tapered regions, plateaus, pyramids, domes, divots, or any combination of protrusions and/or indentations. The surface features can also include triangular, semicircular, or rectangular grooves or ridges, or tapered grooves or ridges (wherein the tapering occurs in any dimension). In addition, 3D surface features can include undercuts, scalloping/ribbing, etched or machined patterns, or other sub-features.

3D surface features 108 can be formed using chemical etching, laser etching, deposition (e.g., chemical vapor deposition (CVD), sputtering, etc.), machining, or another fabrication technique.

Double-Saddle

Figure 2:
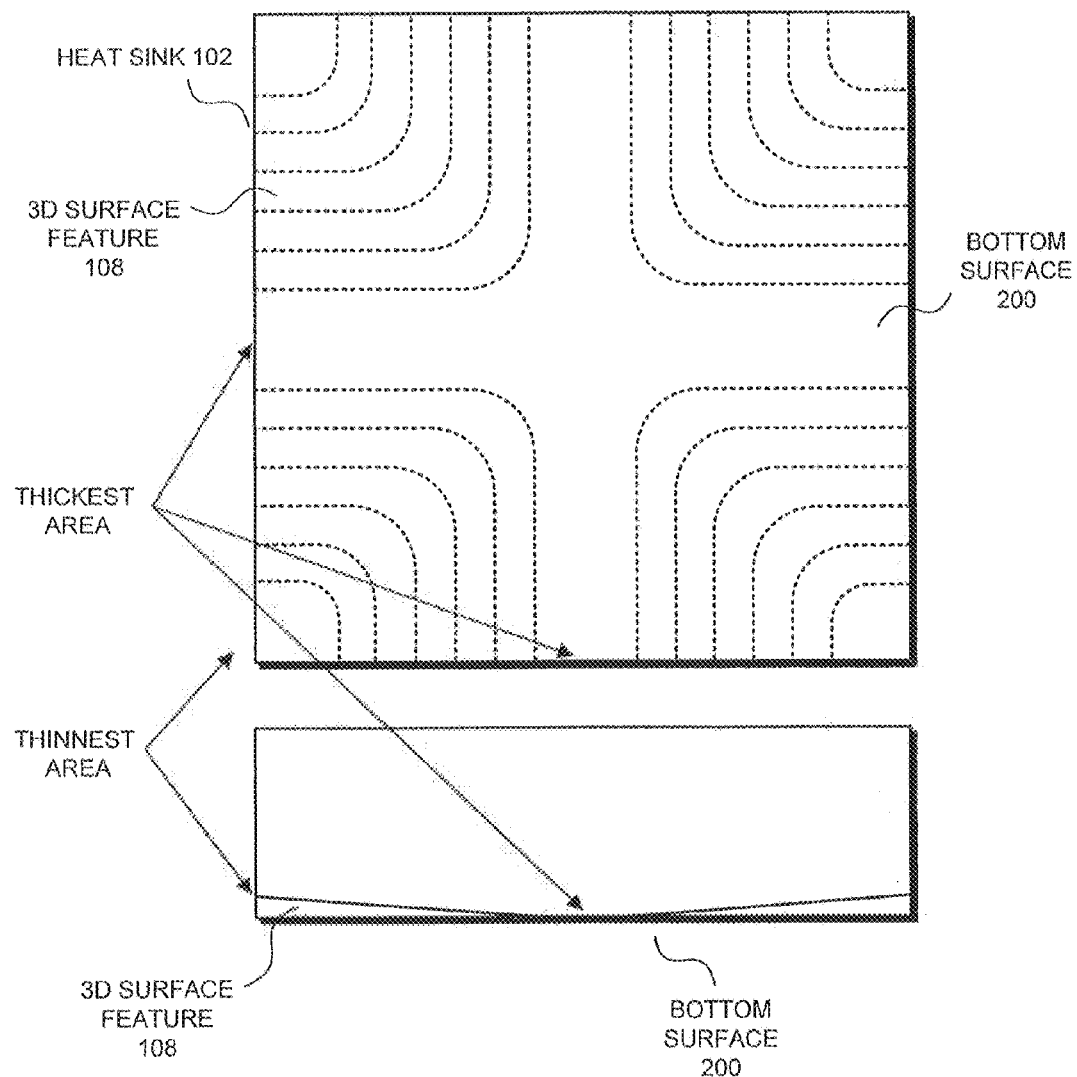
FIG. 2 presents a bottom view and a front view of a heat sink that includes 3D surface features in a double-saddle shape in accordance with some embodiments.

As described above, in some embodiments, the 3D surface features 108 are configured in the double-saddle shape shown in FIG. 1. FIG. 2 presents a further bottom view (at the top of FIG. 2) and a front view of a heat sink 102 that includes 3D surface features 108 in a double-saddle shape in accordance with the described embodiments. Note that the dashed lines shown in FIG. 2 have a similar function to the elevation lines on a typical topographical map; each dashed line represents a relative thickness (i.e., height) of heat sink 102. As shown in FIG. 2, the thickest areas occur on the centerline axis of bottom surface 200, both along the horizontal and vertical axes, while the thinnest areas occur at the corners. In some embodiments, the difference between the thickest area and the thinnest area of heat sink 102 can be approximately 10 microns (although alternative embodiments can use differently-sized differences between the thickest area and the thinnest area).

Figure 3A:
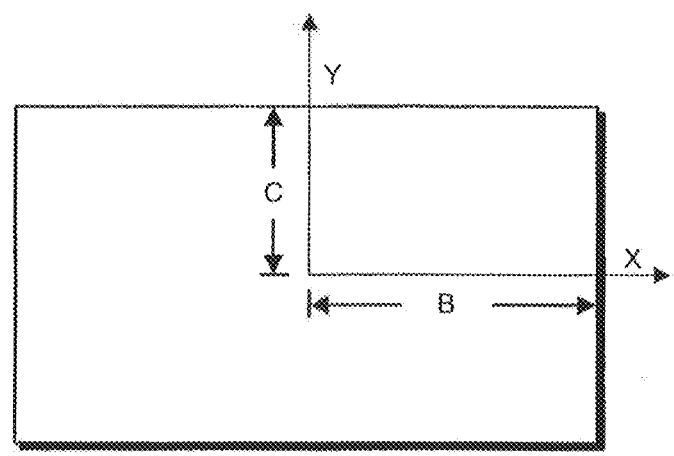
FIG. 3A presents a diagram of a mating surface of a heat sink in accordance with some embodiments.

In some embodiments, the double-saddle shape of the 3D surface features 108 is used to equalize the pressure gradient (ΔP) on TIM 104 across the mating surface as IC 100 and heat sink 102 are pressed together during assembly, resulting in an even distribution of TIM 104. As the following expressions show, assuming that TIM 104 can be modeled as a fluid (e.g., a grease or another viscous substance), a Poiseuille model for fluid flow between two plates shows that the double-saddle configuration of the surface features is one well-suited configuration for equalizing pressure across the mating surface. For this example, we assume plates (i.e., a mating surface) that are shaped similarly to the area shown in FIG. 3A. For such plates, the applicable Poiseuille expression is as follows:

$$\bar{u} = \frac{\Delta P C^2}{\mu L}\left[\frac{1}{3} - \frac{64\varepsilon}{\pi^5}\tanh\frac{\pi}{2\varepsilon}\right], \text{ where } \varepsilon = \frac{C}{B} \text{ for } 0 \le \varepsilon \le 1.$$

For simplification, we assume that the plate width of the mating area is very large (i.e., approaches ∞), arriving at the simplified expression:

$$\Delta P \approx \frac{\bar{u}\mu L}{C^2},$$

where C=the distance (gap) between the plates, μ=TIM material bulk viscosity, and ū=TIM material average velocity. Thus, for constant ΔP and ū, $$\Delta P \propto \frac{L}{C^2}.$$

Figure 3B:
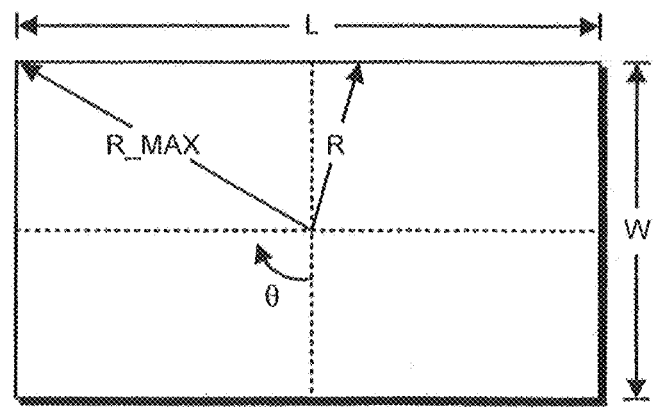
FIG. 3B presents a diagram of a mating surface of a heat sink in accordance with some embodiments.

As can be seen from this expression, the gap that should be maintained between the plates C to keep ΔP constant across the plates can be determined based on L. For a mating surface shaped as shown in FIG. 3B (which is similar to the mating surface shown in FIG. 3A), and modeled using the expression above, the following expressions of R as a function of the angle θ apply, where R is the radius for a given ΔP:

$$\theta_C = \theta \text{ at } R = R_{max}$$
$$\theta_C = \operatorname{atan}(L/W)$$
$$R\max = \sqrt{\left(\frac{L}{2}\right)^2 + \left(\frac{W}{2}\right)^2}$$
$$R\max = W/(2*\cos(\theta)) \text{ for } \theta \le \theta_C, \text{ and}$$
$$R\max = L/(2*\cos(90-\theta)) \text{ for } \theta > \theta_C.$$

As can be seen from these expressions, the surface should be saddle-shaped with the minimum gap along the shortest centerline. Assuming W/L, the minimum gap occurs in the W direction. For example, assuming that $C_O$=minimum gap, $$\frac{W}{2*C_o^2} = const. = \frac{R(\theta)}{C^2},$$
and
$$C = \left[R(\theta)*\frac{2*C_o^2}{W}\right].$$

Figure 4:
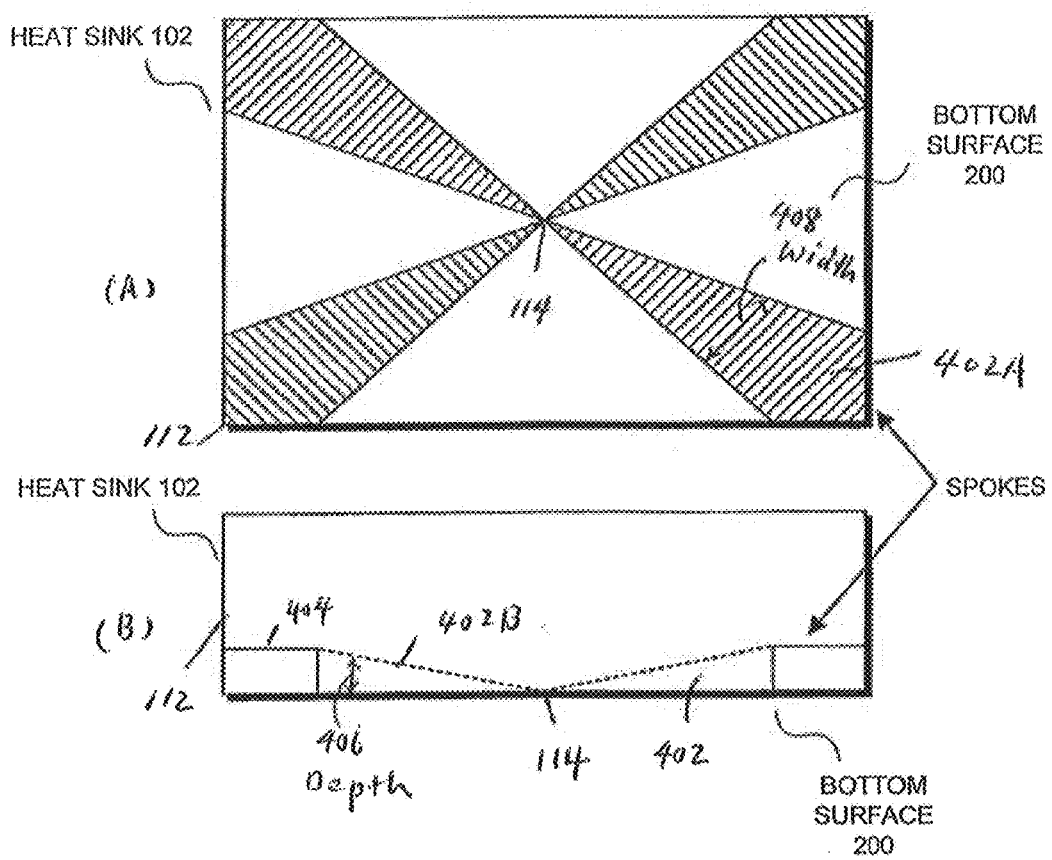
FIG. 4 presents a bottom view and a front view of a heat sink where the 3D surface features are a set of spokes in accordance with some embodiments.

Thus, the gap between the plates (between the mating surfaces) varies linearly along lines of constant θ, appearing as a "saddle" if the mating surfaces are continuous. In embodiments where the mating surface's depth does not vary continuously, some of which may include a plateau 404, the gap between the plates can be formed using a series of "spokes" 402 of changing depth 406. FIG. 4 presents a bottom view (A) (at the top of FIG. 4) and a front view (B) of a heat sink 102 where the 3D surface features are a set of spokes in accordance with the described embodiments. As shown in FIG. 4, the above-described gap between the plates is implemented using a series of spokes (shown using dashed lines 402B in the front view and hash-marks 402A in the bottom view) that radiate outward from the center 114 of the mating surface of heat sink 102 to the corners 112.

The double-saddle shape helps to prevent the stacking of TIM 104 along diagonal lines in the mating surface IC 100 and heat sink 102 that can occur in existing systems that use a smooth mating surface. This "bond-line stacking" occurs because the fluid properties of commonly used TIMs cause the TIM to concentrate along the diagonal lines of the mating surface. By reducing the thickness of the corners of heat sink 102, the pressure is equalized across the mating surface, reducing stacking along the diagonal lines in the mating surface and resulting in an evenly distributed TIM 104.

Note that although we particularly describe the double-saddle shape as reducing the bond-line stacking, other disclosed 3D surface features 108 can reduce bond-line stacking.

Grooves or Ribs

In some embodiments, the 3D surface features 108 include a set of grooves and/or ribs in the mating surface of heat sink 102 and/or IC 100. In these embodiments, groove/rib geometries (i.e., the cross section) can be rounded, triangular, or other geometries or combinations of these geometries. In addition, in some embodiments, the grooves can be tapered, undercut, or can include 3D surface features such as grooves, textures, etched lines, protrusions or indentations, or other sub-features within the grooves.

FIG. 5 presents a number of exemplary groove geometries in accordance with the described embodiments. Example A in FIG. 5 shows a triangle-shaped groove 502A, while example B shows a groove with a circular cross section 502B, example C shows a groove with undercut edges 502C, and example D shows a groove that includes a number of fins or posts 502D. In addition, Example E shows a ridge.

The grooves in some embodiments can be arranged in any pattern or combinations of patterns. FIG. 6 presents examples of groove arrangements in accordance with the described embodiments. Example A in FIG. 6 shows a simplified version of a groove pattern that approximates the locations of capillaries in plant leaves (i.e., biomimicry), e.g., a bio-mimicking pattern 504A. Example B shows a multi-segmented H-tree groove arrangement e.g., an H-tree pattern 504B. Example C shows grooves in a star or burst pattern 504C, e.g., a pattern with straight lines. Example D shows a combination of concentric circles 504D with arced grooves 504E, e.g., a pattern with curved lines. Further, pattern 504D has a geometric shape. (Note that the mating surface in FIG. 6 is not shown as rectangular because the mating surface in embodiments is not limited to being rectangularly shaped.)

Although we present these examples of patterns for grooves, alternative embodiments can use any number of other groove arrangements such as concentric patterns, random patterns, lines, curves, and/or geometric shapes (e.g., triangles, squares, etc.) or combinations of patterns.

In some embodiments, the grooves are arranged to equalize the pressure throughout the mating surface, so that TIM 104 is evenly distributed between IC 100 and heat sink 102. In these embodiments the grooves may not be arranged precisely as shown in FIG. 6, but may be similar to the arrangements shown in FIG. 6 or may be a different arrangement. In addition, in some embodiments the grooves can be arranged to cause a particular post-assembly distribution of TIM 104 during assembly of IC 100 and heat sink 102. For example, in some embodiments, the star or burst groove structures presented in example C in FIG. 6 can be used to cause TIM 104 to flow away from hotspots in IC 100.

Although we describe grooves (and groove geometries), in some embodiments, the grooves are inverted, forming upward-rising "ribs." The ribs can include geometries similar to those described for the grooves. In addition, grooves and ribs can appear together, as part of the same geometry.

Although we describe continuous grooves, in some embodiments a groove can be broken into sections 504D and 504E that are interspersed with flat regions 506 as shown in FIG. 6 or ribbed regions. Furthermore, complementary or contrasting groove patterns, rib patterns, or groove/rib patterns can be located on the mating surfaces of IC 100 and heat sink 102.

In addition, grooves can change geometry along their lengths. For example, a groove can be tapered from wide and nearly flat (e.g. region 506 outside groove 502 in FIG. 6) to steeply sided and narrow (e.g. groove 502) along a given length. In addition, a groove can switch to an entirely separate geometry such as from triangle-cross sectioned to rounded-cross sectioned. Moreover, a groove can include one or more sub-features (i.e., fins, undercuts, protrusions, indentations, etc.) for only a portion of its length, or can include any number of different sub-features separately or together in different locations along its length.

Other Surface Features

Figure 7:
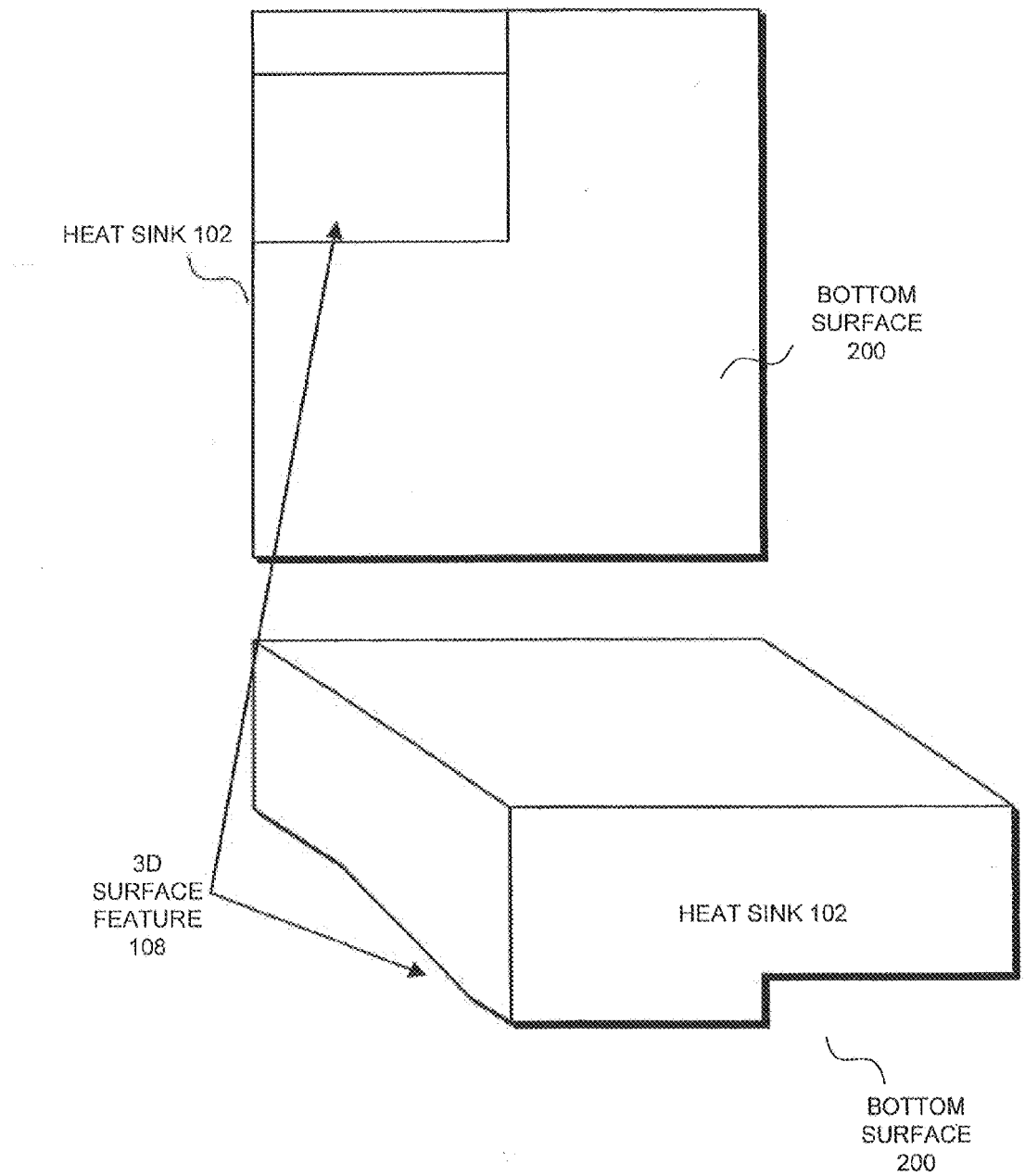
FIG. 7 presents a bottom view and an isometric view of an exemplary 3D surface feature in accordance with some embodiments.

As described above, any 3D surface features 108 or combination of 3D surface features can be used in some embodiments. For example, FIG. 7 presents a bottom view (at the top of FIG. 7) and an isometric view of an exemplary heat sink 102 with a 3D surface feature 108 in accordance with the described embodiments. As shown in FIG. 7, the front left corner of the mating surface of heat sink 102 protrudes down in a rectangular plateau with a ramp leading from midway back on heat sink 102 to the rectangular plateau. This type of 3D surface feature can be used to establish a thin distribution of TIM 104 over the surface of IC 100. Note that in alternative embodiments any number or type of surface feature can be used in either heat sink 102, or IC 100, or both.

In some embodiments, the relative size of the 3D surface features 108 depends on the expected operating environment for IC 100, the operating temperature of IC 100, the properties of TIM 104, and other external or internal factors. Generally, the 3D surface features herein described are on a scale of microns. For example, 10-30 micron 3D surface features can be used in some embodiments.

In some embodiments, more than one type of 3D surface feature can be combined to form a composite surface feature. For example, the "slides" shown in FIG. 4 can be combined with undercutting, etched lines in a predetermined arrangement (i.e., biomimicry, along lines of fluid flow resistance, etc.), ridges/bumps/divots, grooves/ribs, or other 3D surface features. Generally, these features are configured to cause TIM 104 to be distributed in a predetermined pattern.

As described above, in some embodiments, IC 100 includes one or more 3D surface features. In these embodiments, heat sink 102 may or may not also include 3D surface features. In some embodiments, IC 100 and heat sink 102 include complementary or contrasting 3D surface features 108. For example, IC 100 and heat sink 102 can include a matching set of grooves or a 3D surface feature that includes a protrusion on the mating surface of IC 100 that aligns with an indentation on the mating surface of heat sink 102.

Arrangement of Thermal Interface Material

In some embodiments, as TIM 104 is applied to IC 100 and/or heat sink 102, TIM 104 is distributed in a predetermined pattern. The predetermined pattern can assist in achieving a desired post-assembly distribution of TIM 104. For example, TIM 104 can be placed as a drop, a dollop, a line, a circle, or another geometric pattern in a predetermined location on IC 100 or heat sink 102 (or both). The predetermined location can be centered, in a corner, etc. In addition, a different predetermined pattern may be applied to IC 100 than is applied to heat sink 102.

In some embodiments, the distribution pattern of TIM 104 includes multiple drops, lines, or geometric patterns. For example, TIM 104 can be arranged in a grid of drops, a set of circles, a circle surrounded by a set of drops, concentric circles, etc.

In some embodiments, some or all of TIM 104 can be distributed to enable the 3D surface features to cause the desired post-assembly distribution of TIM 104. For example, assuming TIM 104 is a viscous wax, that IC 100 and heat sink 102 are assembled by being pressed together, and that 3D surface features 108 (in IC 100 and/or heat sink 102) are configured to cause TIM 104 to be distributed very thinly over a particularly hot portion of the mating surface of IC 100, two crossing lines of TIM 104 can be placed centered over the hot portion of IC 100 (i.e., applied to IC 100 in this location). When IC 100 and heat sink 102 are pressed together during assembly, TIM 104 can be squeezed between IC 100 and heat sink 102 so that a thin layer remains over the hot portion, while the remaining TIM 104 is distributed around the remaining area of the mating surface.

External Assist Features

In some embodiments, IC 100 and heat sink 102 rely on external assist features when distributing TIM 104. For example, some embodiments use a "moat" structure that surrounds IC 100 and heat sink 102 during assembly. The moat can prevent the loss of TIM 104 that is squeezed or pushed out from between IC 100 and heat sink 102. Alternative embodiments use other external features such as pipes, rods, scrapers, compressed air, pressurized chambers, magnets, heat/cold, or another external assist feature(s).

Figure 8:
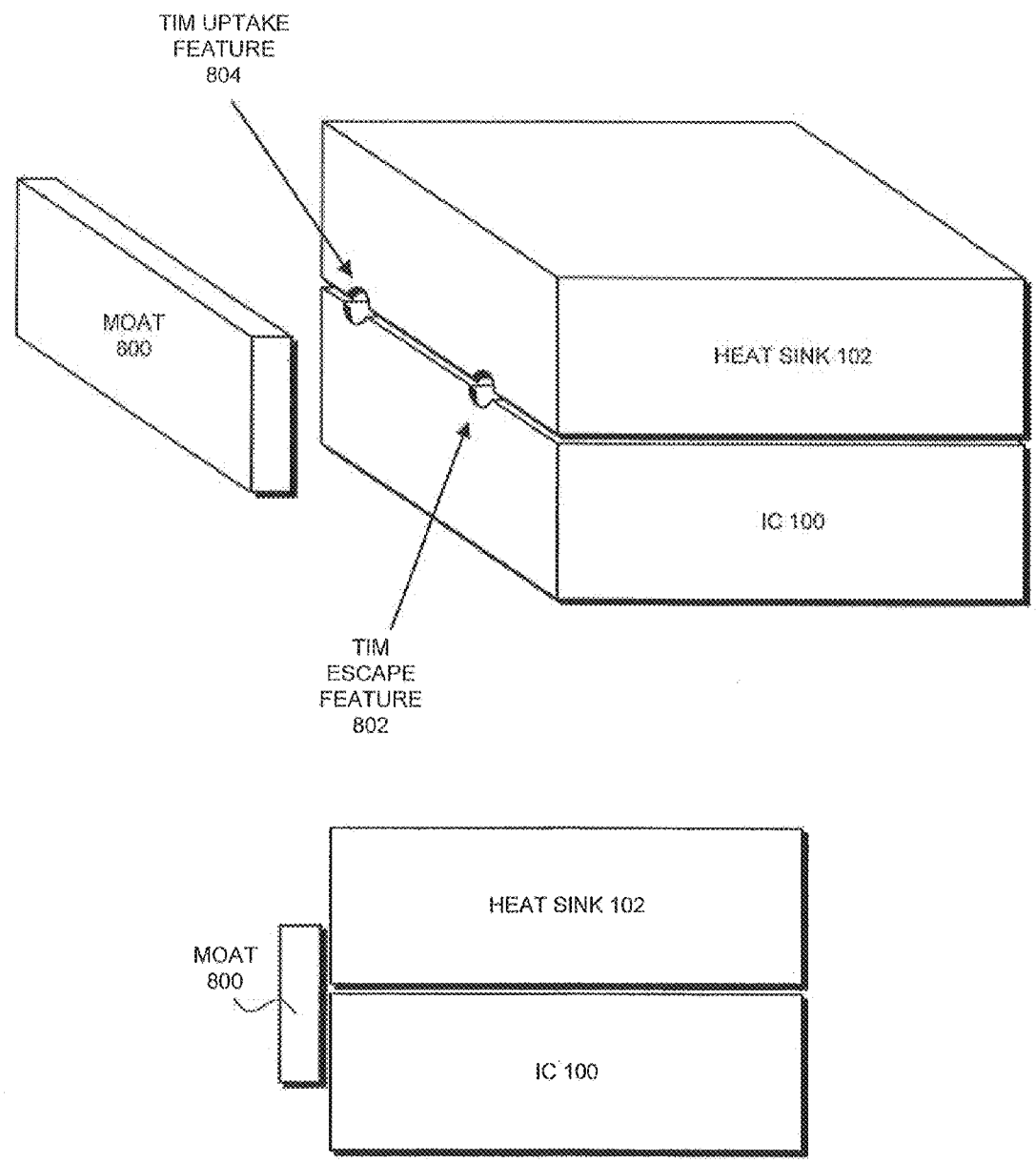
FIG. 8 presents a front view and an isometric view of an external feature in accordance with some embodiments.

FIG. 8 presents a front view (at the bottom of FIG. 8) and an isometric view of a moat 800, IC 100, and heat sink 102 in accordance with the described embodiments. Moat 800 is a mechanism that redirects or prevents outward flows of TIM 104 from between IC 100 and heat sink 102 during assembly. For example, assuming that IC 100 and heat sink 102 are assembled by pressing IC 100 and heat sink 102 together with a layer of TIM 104 located between them, moat 800 can rest against or close to the sides of IC 100 and heat sink 102 to prevent TIM 104 from escaping (or to limit the amount of TIM 104 that does escape).

During assembly, 3D surface features 108 and/or an initial distribution of TIM 104 can be configured to cause TIM 104 to escape from TIM escape feature 802. The escaping TIM 104 can be directed by moat 800 into TIM uptake feature 804, thereby redirecting TIM 104 back in between IC 100 and heat sink 102. In conjunction with the 3D surface features and/or TIM 104's initial distribution, moat 800 can assist in achieving the desired post-assembly distribution of TIM 104. In some embodiments, moat 800 includes one or more surface features (e.g., indentations or protrusions) that assist with the uptake of TIM 104. For example, moat 800 can include a groove or a textured region for directing TIM 104.

In some embodiments, moat 800 is fabricated from a compliant material such as rubber, a flexible plastic, wax, or another material. In alternative embodiments, moat 800 is constructed from a non-compliant material such as metal, ceramic, hard plastic, glass, or another material. Moat 800 can be attached to IC 100 and/or heat sink 102 or can be put in place during assembly and then removed. In some embodiments, moat 800 serves as a seal to prevent TIM 104 from drying out or escaping during operation (particularly as IC 100/heat sink 102/TIM 104 heat up and expand during operation).

Note that moat 800 is shown closer to IC 100 and heat sink 102 in the front view than in the isometric to enable the illustration of the escape and uptake features in the isometric view. During operation, moat 800 is generally located at a proper distance to enable assisting with the distribution of TIM 104.

Process for Coupling Together an Integrated Circuit and a Heat Sink

Figure 9:
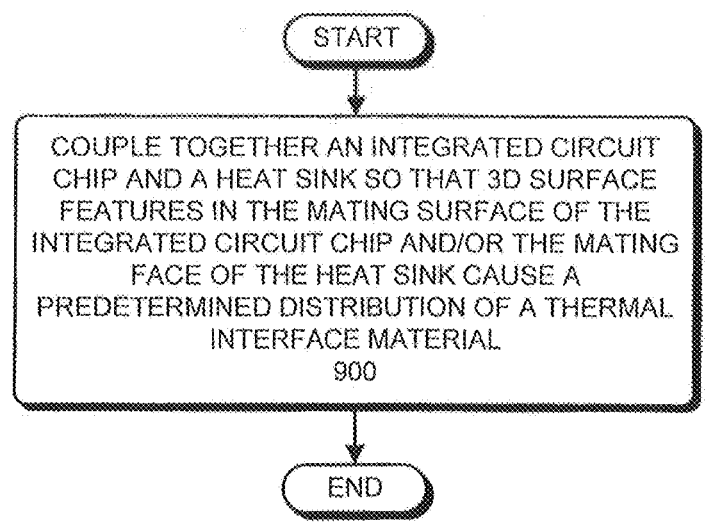
FIG. 9 presents a flowchart illustrating a process for coupling together an integrated circuit and a heat sink in accordance with some embodiments.

FIG. 9 presents a flowchart illustrating a process for coupling together an integrated circuit and a heat sink in accordance with the described embodiments. As shown in FIG. 9, the process involves coupling together IC 100 and heat sink 102 so that 3D surface features 108 in the mating surface of IC 100 and/or the mating surface of heat sink 102 cause a predetermined distribution of TIM 104 (step 900). As described above, the 3D surface features can include any combination of protrusions or indentations. "Coupling together" can include pressing, twisting, clamping, placing, sliding, or otherwise coupling IC 100 and heat sink 102 together.

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. Additionally, the above disclosure is not intended to limit the present embodiments. The scope of the embodiments is defined by the appended claims.

What is claimed is:

1. A heat sink for distributing a compliant thermal interface material (TIM), comprising:
    a mating surface on the heat sink, wherein the mating surface is shaped to distribute the TIM in a predetermined pattern as the TIM is pressed in a gap between the mating surface of heat sink and a corresponding substantially flat mating surface of the integrated circuit chip during an assembly operation, wherein the mating surface of the heat sink is shaped to form a double-saddle such that the gap is larger near each corner region of the heat sink than other regions of the heat sink; and
    at least one groove or ridge in the mating surface of the heat sink.

2. The heat sink of claim 1, wherein the at least one groove or ridge is arranged in at least one of the following patterns:
    an H-tree;
    a bio-mimicking pattern;
    a burst pattern;
    a random pattern;
    a geometric shape;
    a pattern with straight lines; or
    a pattern with curved lines.

3. The heat sink of claim 1, wherein a cross-sectional shape of the at least one groove or ridge is one of the following:
    semicircular; or
    polygonal.

4. The heat sink of claim 1, wherein the at least one groove or ridge is tapered, so that at least one of a width of a groove or ridge or a depth of a groove or ridge varies along a length of the groove or ridge.

5. The heat sink of claim 1, further comprising an external assist feature positioned proximate to the integrated circuit chip and the heat sink, wherein the external assist feature is configured to retain or redistribute the TIM between the mating surface of the integrated circuit chip and the mating surface of the heat sink during the assembly operation.

6. The heat sink of claim 1, wherein the TIM comprises a viscous material, a woven material, a solid material, or a semi-solid material.

7. The heat sink of claim 1, wherein the TIM comprises a material selected from a group consisting of greases, silicone compounds, oils, waxes, pastes, metal particles, carbon, and graphite.

8. The heat sink of claim 1, wherein a cross-sectional shape of the groove or ridge transitions from a first shape to a second shape along a length of the groove or ridge.

9. The heat sink of claim 8, wherein the second shape is more steeply-sided and narrower than the first shape.

10. The heat sink of claim 8, wherein the first shape is v-shaped and the second shape is rounded.

11. An integrated circuit chip for distributing a compliant thermal interface material (TIM), comprising:
    a mating surface on the integrated circuit chip, wherein the mating surface is shaped to distribute the TIM in a predetermined pattern as the TIM is pressed in a gap between the mating surface of integrated circuit chip and a corresponding substantially flat mating surface of a heat sink during an assembly operation, wherein the mating surface of the integrated circuit chip is shaped to form a double-saddle such that the gap is larger near each corner region of the chip than other regions of the chip; and
    at least one groove or ridge in the mating surface of the integrated circuit chip.

12. The integrated circuit chip of claim 11, wherein the at least one groove or ridge is arranged in at least one of the following patterns:
- an H-tree;
- a bio-mimicking pattern;
- a burst pattern;
- a random pattern;
- a geometric shape;
- a pattern with straight lines; or
- a pattern with curved lines.

13. The integrated circuit chip of claim 11, wherein a cross section of the groove or the ridge is one of the following:
- semicircular; or
- polygonal.

14. The integrated circuit chip of claim 11, wherein the groove or ridge is tapered, so that at least one of a width of a groove or ridge or a depth of a groove or ridge varies along a length of the groove or ridge.

15. The integrated circuit chip of claim 11, further comprising an external assist feature positioned proximate to the integrated circuit chip and the heat sink, wherein the external assist feature is configured to retain or redistribute the TIM between the mating surface of the integrated circuit chip and the mating surface of the heat sink during the assembly operation.

16. The integrated circuit chip of claim 11, wherein a cross-sectional shape of the groove or ridge transitions from a first shape to a second shape along a length of the groove or ridge.

17. The integrated circuit chip of claim 16, wherein the second shape is more steeply-sided and narrower than the first shape.

18. The integrated circuit chip of claim 16, wherein the first shape is v-shaped and the second shape is rounded.

19. A method for assembling a system which includes an integrated circuit chip and a heat sink, comprising:
- applying a compliant thermal interface material (TIM) to at least one of the mating surface of the heat sink and the mating surface of the integrated circuit chip; and
- assembling together the mating surface of the heat sink and the mating surface of the integrated circuit chip;
- wherein the mating surface of the heat sink or the mating surface of the integrated circuit chip is shaped to form a double-saddle to distribute the TIM in a predetermined pattern as the mating surface of heat sink and the mating surface of the integrated circuit chip are assembled together, wherein the corresponding mating surface of the integrated circuit chip or the heat sink is substantially flat, wherein the at least one of the mating surface of the heat sink and the mating surface of the integrated circuit chip comprises at least one groove or ridge arranged in the predetermined pattern.

20. The method of claim 19, wherein assembling together the mating surface of the heat sink and the mating surface of the integrated circuit chip involves at least one of pressing, sliding, clamping, twisting, or otherwise placing together the mating surface of the heat sink and the mating surface of the integrated circuit chip so that the shape of the mating surface of the heat sink and the mating surface of the integrated circuit chip cause the TIM to be distributed in the predetermined pattern.

21. The method of claim 19, wherein prior to assembling together the mating surface of the heat sink and the mating surface of the integrated circuit chip, the method further comprises positioning an external assist feature proximate to the integrated circuit chip and the heat sink, wherein the external assist feature is configured to retain or redistribute the TIM between the mating surface of the integrated circuit chip and the mating surface of the heat sink as the mating surface of the integrated circuit chip and the mating surface of the heat sink are assembled together.

22. The method of claim 19, wherein the groove or ridge is arranged in at least one of the following patterns:
- an H-tree;
- a bio-mimicking pattern;
- a burst pattern;
- a random pattern;
- a geometric shape;
- a pattern with straight lines; or
- a pattern with curved lines.

23. The method of claim 19, wherein a cross-sectional shape of the groove or ridge transitions from a first shape to a second shape along a length of the groove or ridge.

* * * * *